United States Patent [19]
Goto

[11] Patent Number: 6,084,848
[45] Date of Patent: Jul. 4, 2000

[54] TWO-DIMENSIONAL NEAR FIELD OPTICAL MEMORY HEAD

[75] Inventor: Kenya Goto, Yokohama, Japan

[73] Assignees: Kabushiki Kaisha Toshiba, Kawasaki; Tokai University Educational System, Tokyo, both of Japan

[21] Appl. No.: 08/967,000

[22] Filed: Nov. 10, 1997

[30] Foreign Application Priority Data

Nov. 11, 1996 [JP] Japan ..................................... 8-298981
Dec. 9, 1996 [JP] Japan ..................................... 8-328689

[51] Int. Cl.[7] ....................................................... G11B 7/00
[52] U.S. Cl. ............................................................. 369/121
[58] Field of Search ..................................... 369/112, 121, 369/122; 372/45, 46, 50, 92, 43

[56] References Cited

U.S. PATENT DOCUMENTS 5,808,986 9/1998 Jewell et al. ......................... 369/121 X
5,886,972 3/1999 Jiang et al. ........................... 369/122 X

*Primary Examiner*—Paul W. Huber
*Attorney, Agent, or Firm*—Pillsbury Madison & Sutro LLP

[57] ABSTRACT

Disclosed is an optical memory head in which a vertical cavity surface emitting laser array constituted by laying out, in a matrix form, a large number of vertical cavity surface emitting laser elements each having a laser output part with an ultra fine hole as an output window for emitting evanescent light is arranged such that the layout direction of the laser element is inclined with respect to the tangential direction to rotation of an optical recording medium at a fine angle.

46 Claims, 9 Drawing Sheets

TANGENTIAL DIRECTION TO
ROTATION OF OPTICAL
RECORDING MEDIUM

PARALLEL
TANGENTIAL DIRECTION TO
ROTATION OF OPTICAL
RECORDING MEDIUM

TWO-DIMENSIONAL NEAR FIELD OPTICAL MEMORY HEAD

BACKGROUND OF THE INVENTION

1. Field of the Invention

The present invention relates to an optical memory head for writing a large amount of information on an optical recording medium and reading a large amount of information from an optical recording medium and a magneto-optic recording medium by a vertical cavity surface emitting laser (VCSEL) array in an optical memory disk apparatus.

2. Description of Related Art

A conventional optical memory head in a magneto-optic writing apparatus forms a beam spot by focusing a laser emitted by a laser diode, i.e., a semiconductor laser, upon oscillation by using an optical focusing element such as a lens, and irradiates the beam spot on a ROM disk such as a CD (compact disk) or a DVD (digital versatile or video disk), an optical recording medium, or a magneto-optic recording medium. The head also may detect the reflecting light, thereby reading or writing information. A writing density of around $10^7$ to $10^8$ bit/cm² has been realized by forming a fine beam spot having a diameter of about 1 µm.

The optical memory head detects the header information of the optical recording medium or the reflecting light (tracking signal) reflected by a tracking guide formed on the medium, and is tracking-controlled by an actuator (device for moving the beam position) in order of 0.1 µm. In this case, one laser diode or the like is used for writing/reading most frequently. There has been an attempt to use a single vertical cavity surface emitting laser in an optical memory disk writing/reading apparatus. However, this has not proven practical because it has only recently been developed and is very expensive.

Most of conventional optical memory disk writing/reading apparatuses use the floating head system in which the head does not contact the optical recording medium. No apparatus uses the contact head system in which the optical memory head writes and reads out data in contact with the optical recording medium via a lubricant.

The conventional optical memory disk writing/reading apparatus can write a larger amount of information on the optical recording medium or the like as the diameter of the beam stop is smaller. However, since its optical memory head complies with conventional classic geometrical optic principles involved in using an optical focusing element, a laser beam can only be focused on a spot size up to a diameter about equal to the used light wavelength or about a fraction thereof due to diffraction limited restriction of the light wave-length. Even in an optical recording medium 120 mm in diameter which is frequently used, a recording capacity of 10 GB can be ensured at most. For this reason, the appearance of an epochal optical memory head capable of ensuring a larger recording capacity is desired to strongly support the rapid technical advance in memory storage and the like in today's multimedia communications.

BRIEF SUMMARY OF THE INVENTION

It is an object of the present invention to provide a writing/reading optical memory head having a vertical cavity surface emitting laser array (laser diode array) constituted by laying out, in a matrix form, a large number of vertical cavity surface emitting lasers each having a laser emitting portion with an ultra fine hole window.

It is another object of the present invention to provide a writing/reading optical memory head in which a vertical cavity surface emitting laser element is used. The contact head system maintains a distance of about 10 nm between the optical memory head and a recording medium in order to eliminate the limitation of optical principles inevitable for an optical focusing element represented by a lens, Another object of the present invention is to develop a very-large-capacity memory disk writing/reading apparatus.

According to the present invention, an optical memory head comprises a vertical cavity surface emitting laser array (laser diode array) constituted by laying out, in a matrix form, a large number of vertical cavity surface emitting laser elements each having a laser output component with an ultra fine hole as an output window for light.

According to the present invention, an optical memory head comprises a vertical cavity surface emitting laser array constituted by laying out, in a matrix form, a large number of vertical cavity surface emitting laser elements each having a laser output component with a fine part for emitting light, and a mechanism for arranging the laser array so as to slightly incline a layout direction of the laser elements of the laser array with respect to a tangential direction to rotation of an optical recording medium at a fine angle.

In this specification, a laser beam means all laser waves generated by laser oscillation elements such as a laser beam emitted by the above-mentioned laser diode, i.e., the semiconductor laser upon oscillation, and an evanescent wave emitted by a vertical cavity surface emitting laser having an ultra fine hole window at an output portion.

Additional objects and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
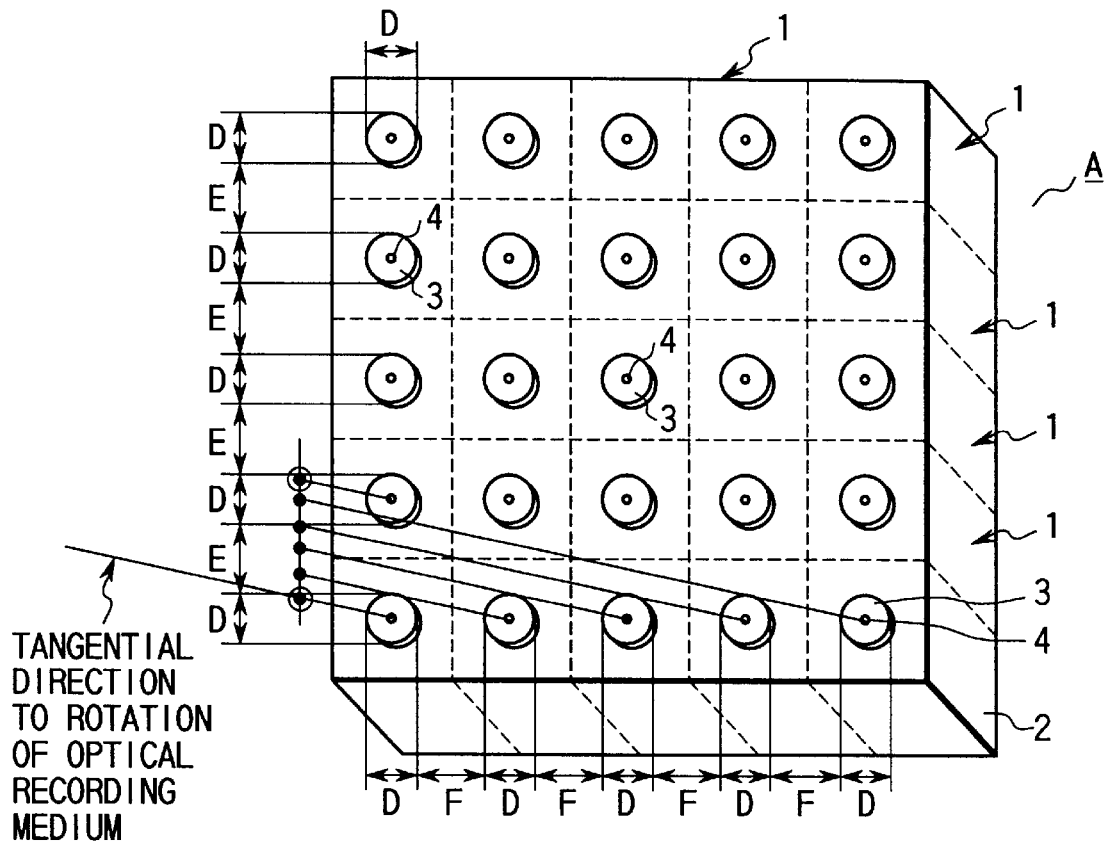
FIG. 1 is a perspective view that illustrates an optical memory head in order to explain the principles of the present invention.

Embodiments of the present invention will be described below with reference to the several views of the accompanying drawings. FIG. 1 shows an optical memory head comprising a plurality of vertical cavity surface emitting lasers, i.e., VCSEL elements 1 arranged in a matrix form. In FIG. 1, each VCSEL element 1 is comprises a substrate 2 with a predetermined thickness containing a multi-layered reflection mirror 2a and a multi-quantum well laser active layer 2b, and a laser emitting portion 3 formed by a protrusion component from which a laser beam is emitted. An ultra fine hole 4 for an output window for emitting a beam of evanescent light vertically upward is formed in the center of the upper surface of the laser emitting portion 3 as viewed from FIG. 2.

Figure 2:
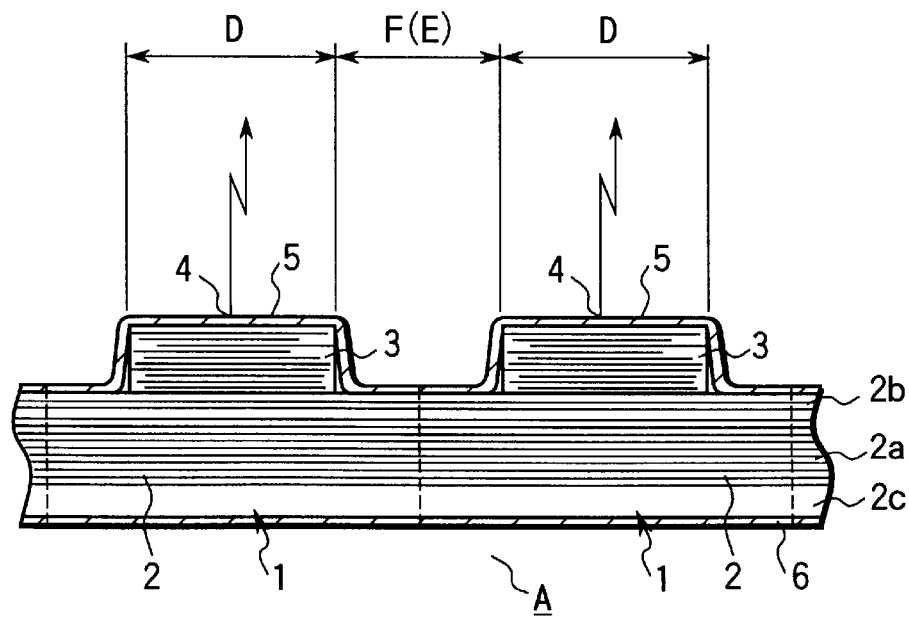
FIG. 2 is a sectional view of the light-emitting portion of an optical memory head according to an embodiment of the present invention.

FIG. 2 is a sectional view of the VCSEL element 1. The VCSEL element 1 comprises the laser emitting portion 3 and the substrate 2. The surface of the laser emitting portion 3 is coated with a thin metal film 5 having a thickness of about 10 nm to 100 nm in order to prevent leakage of light. The metal film 5 is used as an electrode of the laser diode. The substrate 2 is coated with striped electrodes 6. The ultra fine hole 4 formed in the center of the laser emitting portion 3 has a diameter not less than, or not more than about one hundredth ($1/100$) of a wavelength of a laser oscillation beam in a vacuum, e.g., a diameter of about 10 nm. Via the ultra fine hole 4, evanescent light generated by laser oscillation is emitted as only one laser beam vertically upward as viewed from FIG. 2.

The material of the VCSEL element 1 including a laser material is a common substance such as n-AlGaAs/GaAs and p-AlGaAs/GaAs. To improve the laser output and the like, the VCSEL element 1 may also be formed of a material having physical properties similar to or different from those of the aforementioned materials.

The laser emitting portion 3 is formed to a size equal to, smaller than, or larger than the wavelength of a laser oscillation beam in a vacuum. If a larger size is selected, the ultra fine hole 4 may be formed to have a diameter equal to the diameter of the laser (see a chain double-dashed line portion in FIG. 3).

The plurality of VCSEL elements 1 arranged in a matrix form at a predetermined interval make up a vertical cavity surface emitting laser array A, which is called a VCSEL array A. In practically manufacturing the VCSEL array A, VCSEL elements 1 are simultaneously formed in a matrix form by a general epitaxial growth method or the like, instead of joining and laying out a plurality of VCSEL elements 1. Conceptually, the VCSEL array A is made by joining and laying out a plurality of VCSEL elements 1. At this time, the ultra fine hole 4 can be formed by an etching substrate method or a hole method using a focused ion beam.

The laser beams emitted by the VCSEL elements 1 arranged on the same row form beam paths corresponding to the number of elements of one line on the recording layer of an optical recording medium or magneto-optic recording medium (not shown). For descriptive convenience, assume that the VCSEL array comprises 5 (rows)×5 (columns) of VCSEL elements 1. In this specification, the row means one line along the tangential direction to rotation of the optical recording medium, and the column means one line along the radial direction of the optical recording medium.

Five VCSEL elements 1 arranged on the fifth row and the first to fifth columns in the 5×5 VCSEL array A in FIG. 1 emit a total of 5 laser beams coming out of the page. As a result, 5 beam spots are formed on the recording layer of the optical recording medium (not shown) arranged to face the VCSEL array A. Since information is written in or read out from the optical recording medium while the optical recording medium rotates, the paths of 5 laser beams are drawn on the recording layer. However, when the optical recording medium and the VCSEL array A are arranged such that the tangent to rotation of the optical recording medium is parallel to the row direction in the VCSEL array A, the paths of the 5 beam spots drawn on the recording layer overlap each other, resulting in one path. For this reason, the VCSEL array A is inclined at a predetermined fine angle with respect to the tangent to rotation of the optical recording medium. Accordingly, the 5 beam spots can easily fall between two beam spots formed by two VCSEL elements 1 arranged on the same column and adjacent rows, i.e., two beam spots formed by two VCSEL elements 1 positioned on the fourth row and first column and the fifth row and first column. Note that one beam spot formed by the VCSEL element 1 positioned on the third row and first column that serves as an end point includes 5 beam spots. Therefore, since 5 continuous paths which do not overlap each other can be drawn on the recording layer of the recording medium along with rotation of the optical recording medium, information corresponding to 5 tracks can be written or read out.

An embodiment in which the number of simultaneously writable/readable tracks is increased by further increasing the number of VCSEL elements 1 in the VCSEL array A on the basis of the above function will be described below with reference to the several views of the accompanying drawing. In this specification, the "optical recording medium" is a general term for optical disks including a read only optical disk (e.g., CD-ROM and DVD-ROM) that is a so-called WORM (write once read many) optical recording medium in which writing (recording) can be performed only once, and a phase change optical disk (PC) that is a rewritable optical recording medium, a magneto-optical disk and a photon mode recording medium. The magneto-optic recording medium is a general term for a so-called magneto-optic disk (MO) and the like.

Figure 6A:
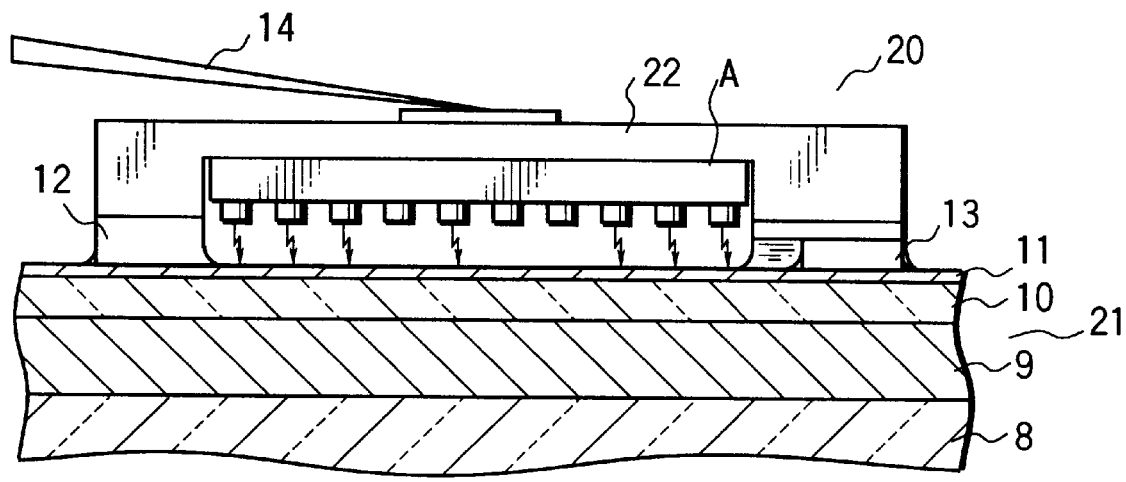
FIGS. 6A and 6B are a partial enlarged sectional view and a plan view of an optical memory head of the contact head system, respectively.
Figure 6B:
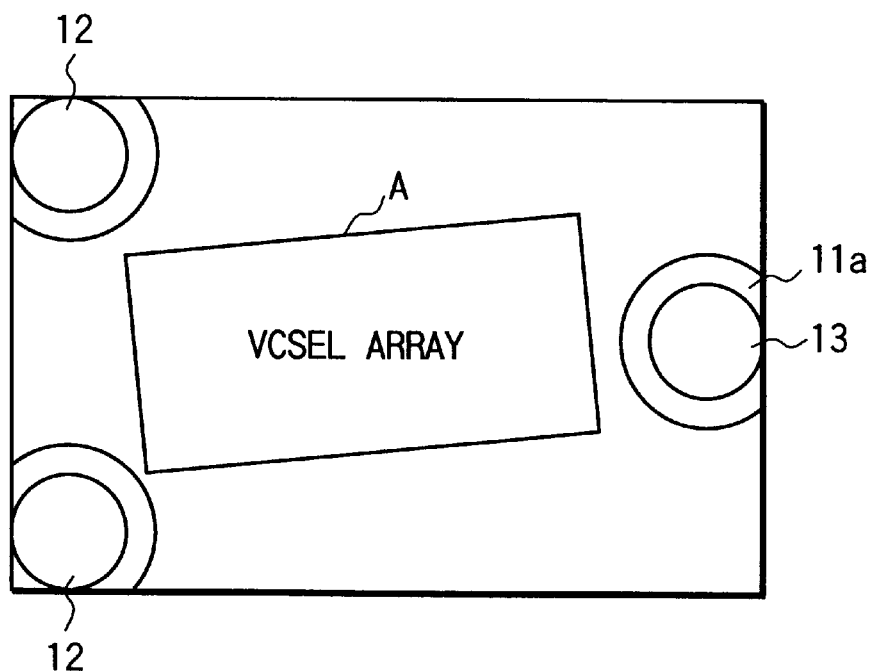

An optical memory head 20 for reading out information written by the writing VCSEL array A will be explained with reference to FIGS. 6A and 6B. This readout is performed by monitoring the presence/absence of laser oscillation of the VCSEL element 1, and making the presence/absence correspond to binary data to read information written in an optical disk 21 serving as an optical recording medium. More specifically, light is irradiated on the optical recording medium to read information in accordance with the presence/absence of a data bit written in the optical recording medium, i.e., a data bit formed of a mark (or pit) having a diameter of, e.g., 10 to 20 nm on the basis of the light reflected by the optical recording medium. If the data bit is written in a crystal state having a high reflectance when the data bit exists, light reflected by the data bit is incident on the VCSEL array A via the ultra fine hole 4 to excite the VCSEL element 1 and make it lase. If the data bit is written in an amorphous state having a low reflectance when no data bit exists, no effect that makes the VCSEL element 1 lase is obtained even when light reflected by the data bit enters the VCSEL element 1 via the ultra fine hole 4. Therefore, by monitoring the presence/absence of laser oscillation, and making the presence/absence correspond to binary data, information written by the writing VCSEL array A can be read. To increase the read efficiency, the following processing is adopted. That is, to decrease the Q value of each laser resonator, the mirror of a laser output portion is coated with an anti-reflection film. In addition, a thin metal film or the like for preventing transmission of light is applied on the upper surface of the laser output portion except for the ultra fine hole window.

The ultra fine hole 4 is formed to have a diameter of about 10 nm, as described above. In this case, an injection current flows through each VCSEL element 1 across the electrodes 5 and 6. Since the small hole portion (including the central small hole) is covered with the anti-reflection film, as described above, the VCSEL element 1 does not lase in this state even with a large injection current. Therefore, the injection current is adjusted such that, even when a low-reflectance data bit written in the recording layer of the optical recording medium or the like positions above the ultra fine hole 4, the VCSEL element 1 is not excited by light reflected by the data bit. With this adjustment, a data bit written in the optical recording medium can be read by the above-described mechanism. Although the writing (recording) optical memory head and the reading (reproducing) memory head are separately described for descriptive convenience, the optical memory head can be commonly used for writing and reading. However, since a stronger laser must be generated in writing than in reading bits, dedicated writing and reading optical memory heads are preferably arranged for practical use.

An ideal optical memory disk writing/reading apparatus as an embodiment of the present invention can be obtained if the optical memory head of the present invention replaces a conventional head portion, a conventional micro-actuator having a precision of 10 nm replaces a conventional actuator, and a conventional airflow flying head or a conventional floating head using an electromagnetic force spring is employed as a conventional contact head technology in an optical memory disk writing/reading apparatus using a conventional light-emitting diode or the like.

The contact head technology is a writing/reading technique in which an optical memory head is brought into contact with an optical recording medium or the like via a lubricant. FIG. 6A shows a conceptual view of this embodiment. In FIG. 6A, the optical disk 21 serving as an optical recording medium is formed of a glass substrate 8, an optical disk medium layer 9 serving as a recording surface formed on the glass substrate 8, and an optical recording medium protecting film 10 having a thickness of about 5 to 10 nm on the surface of the optical disk medium layer 9. The optical recording medium layer 10 is formed of e.g., $Ge_2As_2Te_5$. The recording medium protecting film 10 is formed of an amorphous carbon film.

The optical disk 21 is horizontally set with its recording surface facing up. A thin film 11 having a thickness of about 1 nm is formed of a lubricant such as perfluoropolyether on the surface of the recording medium protecting film 10.

The optical memory head 20 has the VCSEL array A attached upside down to a heat sink 22 with the laser output portion facing down. The optical memory head 20 is supported above the optical recording medium via the thin lubricant film 11 by only a total of three points, i.e., two circular leading pads 12 and one circular trailing pad 13, each of which is arranged on the bottom surface of the optical memory head 20 and has a diameter of about 100 $\mu$m, The optical memory head 20 is lightly pressed from above by a gimbals member 14 including a commercially available punched suspension. Accordingly, so-called meniscuses shown in FIG. 6B are formed around the circular trailing pad 13 and the circular leading pads 12 by the surface tension of the lubricant. By the tension of the meniscuses, the jump amount upon rotation of the optical recording medium or the like is reduced, and optical writing/reading is stably performed. This will be further analyzed and explained. The thin perfluoropolyether film 11 about 1 nm thick is made up of two mono layers. One of the mono layers serves as a bonded layer with respect to the recording medium protecting film 10, and the other serves as a mobile layer movable along the bonded layer. That is, the coupling layer chemically couples with the molecules of the protecting film 10, and the mobile layer becomes a mobile layer movable together with the three pads 12 and 13. By this mobile layer, the pads 12 and 13 can stably travel on the surface of the optical disk 21. This writing/reading technology is called a contact head technology.

Figure 7:
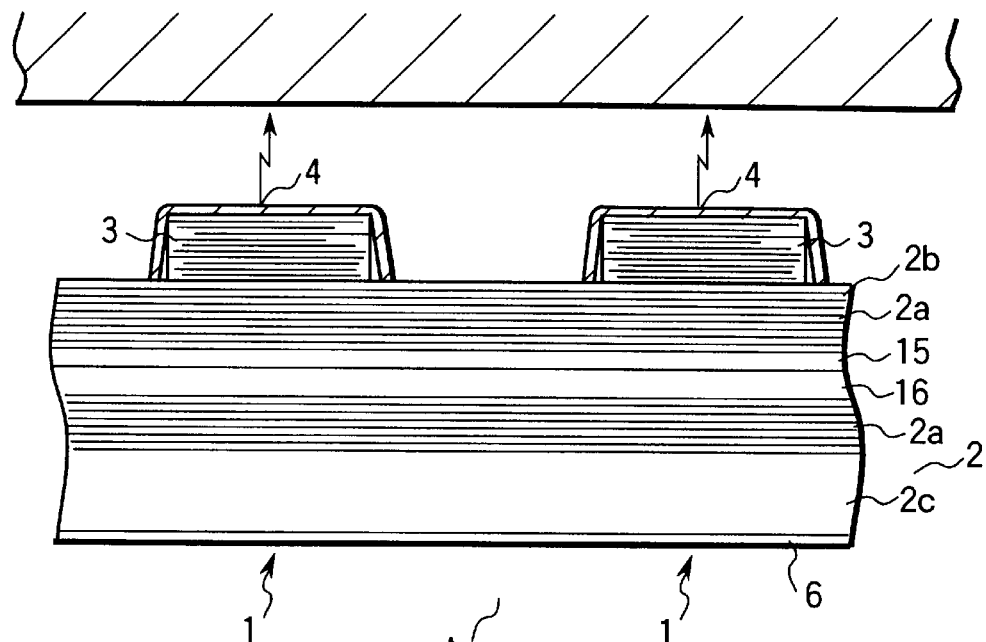
FIG. 7 is a partial enlarged sectional view of a single element of a magneto-optic head.

A so-called $\lambda/4$ film 15 and a Faraday rotator film 16 can be formed on the optical memory head 20 to build an ideal magneto-optic memory head. The outline of application of the VCSEL array A to magneto-optic writing/reading will be described with reference to FIG. 7. In the VCSEL element 1, the so-called $\lambda/4$ film 15 with an orientation which is coated by ECR (Electron Cyclotron Resonance) sputtering or the like, and the Faraday rotator film 16 are formed on the substrate 2 constituted by the n-AlGaAs/GaAs multi-layered reflection mirror and the laser active layer. When a TE wave is generated by the VCSEL element 1, the TE wave is reflected by a magneto-optic recording medium via the $\lambda/4$ film to reenter the $\lambda/4$ film and return to the laser active layer. At this time, the TE wave changes to a TM wave having light wave electric field components having an oscillation direction 90° different from those of the TE wave. If a data bit is written in the magneto-optic recording medium using the difference in magnetization direction, a phase difference appears between the TE and TM waves reflected by the optical disk medium and generated in the VCSEL array A. In this case, a Schottky diode is inserted between the multi-layered reflection mirror 2a and the GaAs substrate 2c to generate a high-frequency wave equivalent to the difference frequencies of the two light waves in accordance with the magnetization direction of the magneto-optic film on the disk. By detecting this high-frequency wave, information is written or read out. Since a magnetic substance is required for writing in constituting this magneto-optic memory head, the sides of the writing/reading VCSEL array A are covered with a magnet or magnetic substance necessary for magneto-optic optical writing to use the obtained magnetic field for both the magnetic fields of the Faraday optical element and magneto-optic optical writing.

Another embodiment of an optical memory head in which a faulty element compensation array is arranged in the optical memory head of the present invention will be described below with reference to FIG. 8. When some VCSEL elements 1 fail in a VCSEL array A, the faulty VCSEL array A is not replaced with a new one, but the faulty elements are replaced with other VCSEL elements 1. That is, another VCSEL array A identical to the VCSEL array A is arranged as a spare. More specifically, the first VCSEL array A and the second VCSEL array A identical to the first one are arranged. When a faulty element in the first VCSEL array A which exists on the first row and 10th column is represented by I(1–10), a corresponding compensation element in the second VCSEL array A exists on the first row and 10th column, which can be represented by II(1–10). A path drawn on an optical recording medium by a laser beam from I(1–10) of the first VCSEL array A is the same as the path of a laser beam from II(1–10) of the second VCSEL array A. Therefore, at the same time the fault of I(1–10) of the first VCSEL array A is detected by a signal control portion or the like (not shown), the normal VCSEL element II(1–10) of the second VCSEL array A is used for compensation.

Figure 3:
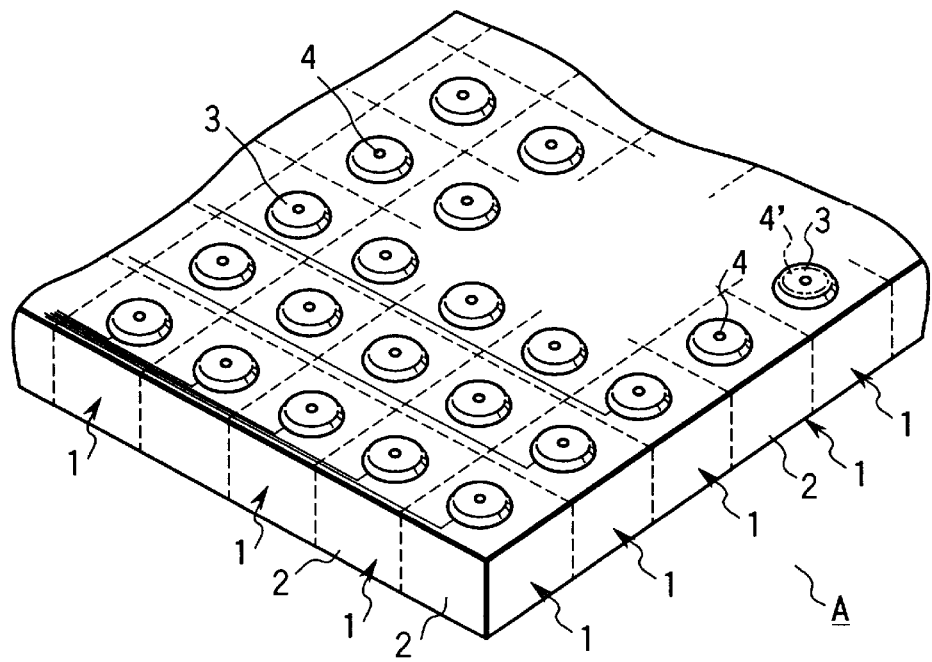
FIG. 3 is a perspective view of the optical memory head in FIG. 2.
Figure 4:
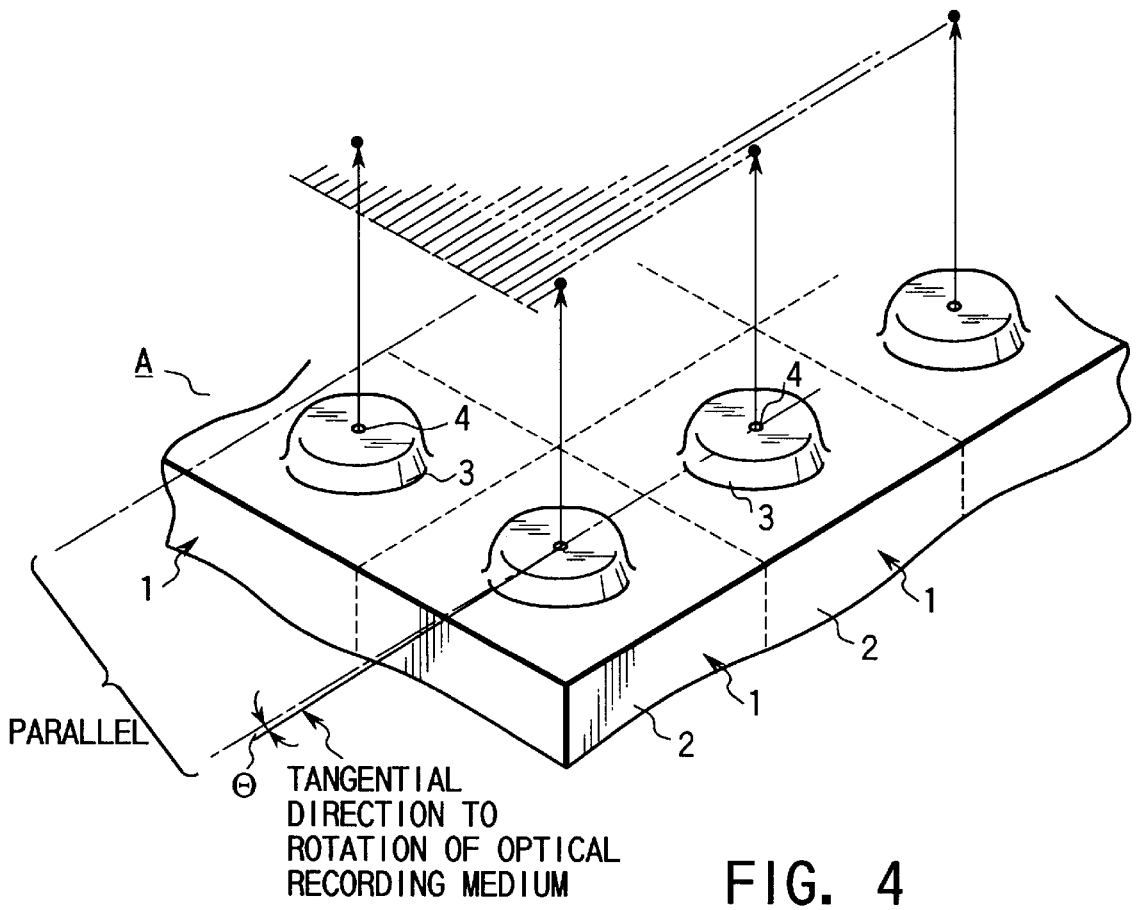
FIG. 4 is an enlarged perspective view of part of the optical memory head in FIG. 2.
Figure 5A:
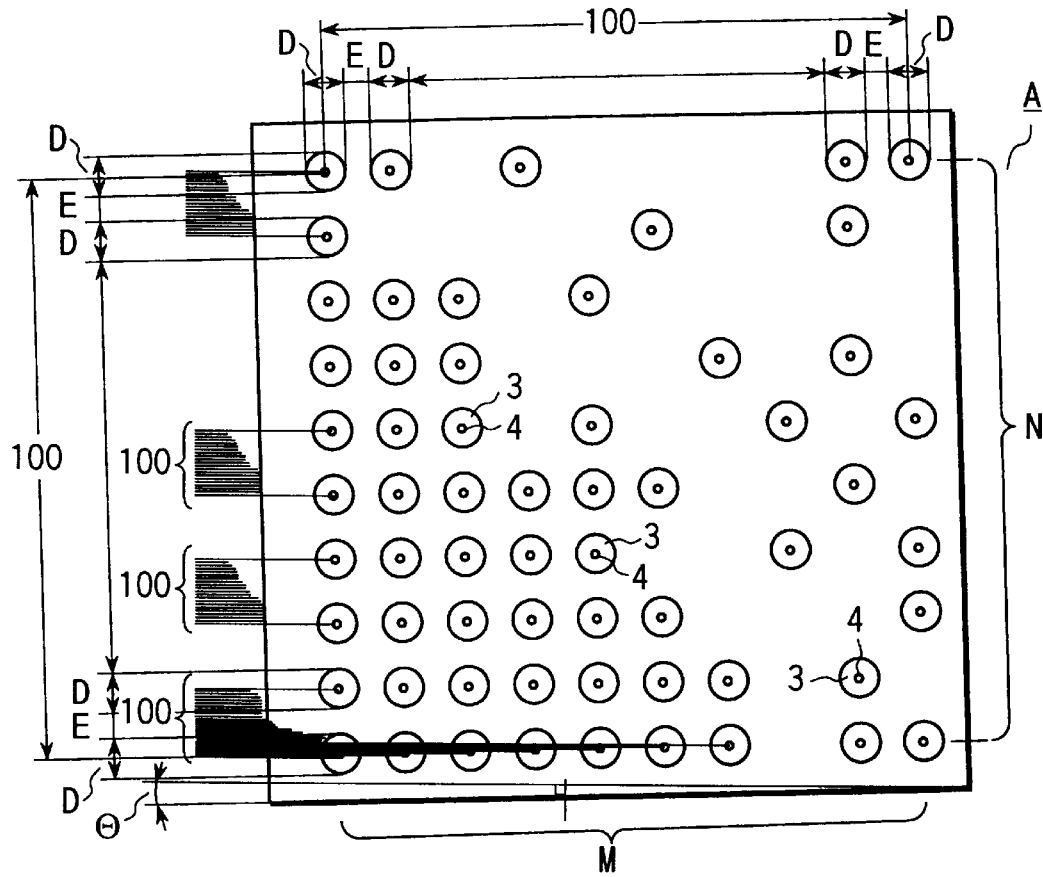
FIG. 5A is a plan view of the optical memory head in FIG. 2.

FIG. 3 shows the VCSEL array A used in the optical memory head of the present invention. This VCSEL array A is made up of a plurality of VCSEL elements 1, individual electrodes, and a common electrode. Each VCSEL element 1 comprises a substrate 2 and a laser emitting portion 3. The VCSEL elements 1 ideally form a regular matrix in which the diameter of each laser emitting portion 3 is 1 $\mu$m, and the interval between the respective VCSEL elements is 2 $\mu$m. As an optimum arrangement, VCSEL elements 1 are arranged in a regular matrix having 100 VCSEL elements 1 in the X-axis direction and 100 VCSEL elements 1 in the Y-axis direction, as shown in FIG. 5A. An ultra fine hole 4 having a diameter of about 10 nm is formed in the center of the laser emitting portion 3 of each VCSEL element 1. The ultra fine hole 4 can be formed in the laser emitting portion by etching a silicon nitride solid crystal or the like to form a plurality of needle arrays, moving the pointed distal tip of a fine needle to above the center of the laser emitting portion, and then lightly pressing the distal tip against the center. The ultra fine hole 4 functions as an output window for externally emitting an evanescent light wave generated by the VCSEL element 1 as a beam. The laser emitting portion 3 has a columnar shape with a small height, but may have any other three-dimensional shape such as a square prism or a rectangular prism.

Figure 5B:
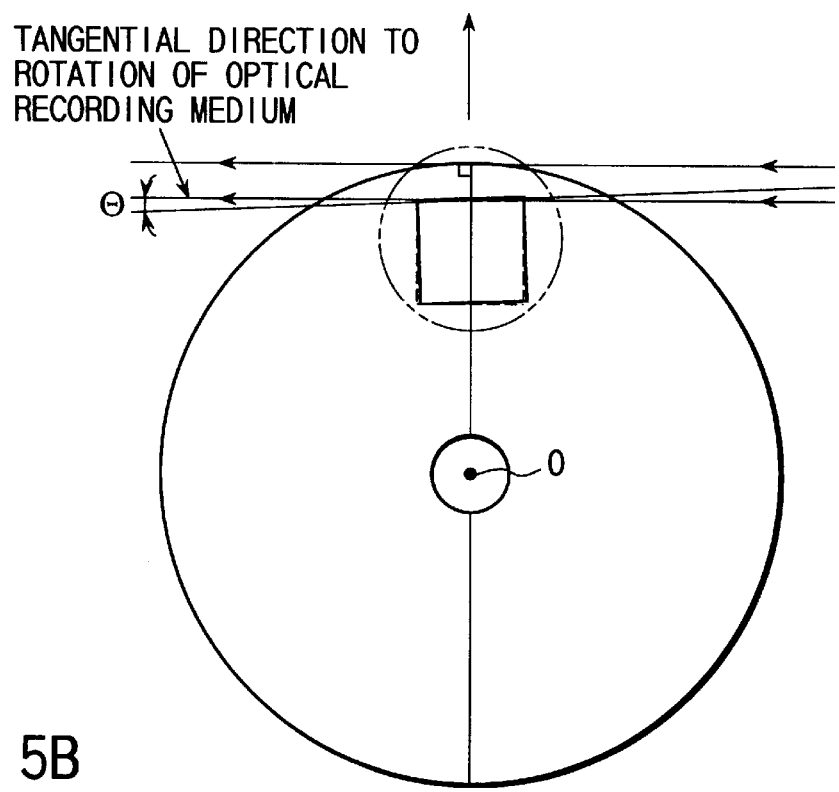
FIG. 5B is a plan view showing the arrangement relationship between the optical memory head in FIG. 2 and an optical recording medium.

FIGS. 5A and 5B show how the 100×100 VCSEL array A writes information in an optical recording medium. For descriptive convenience, the VCSEL array A is horizontally placed on a contact slider of about 0.3 mm×0.3 mm area size with the ultra fine hole windows 4 facing up, and the optical recording medium is arranged above the VCSEL array A at a very small distance such that the recording layer is parallel to and faces the VCSEL array A. A total of 10,000 laser beams emitted vertically upward from the 100×100 VCSEL array A form a total of 10,000 beam spots on the recording layer of the optical recording medium over a width of 200 $\mu$m. FIG. 5A shows an enlarged part of the path of the beam spot. Since a point which the beam spot strikes is recessed or changes in reflectance or color depending on the material of the recording layer, similar to a writing method in a general optical recording medium, information is written in the optical recording medium by a well-known method of making the change correspond to a binary signal.

If the VCSEL array A is set to be inclined at a fine angle with respect to the tangent to rotation of the optical recording medium (tangential direction of the optical disk), as shown in FIGS. 5A and 5B, 10,000 continuous paths of 10,000 beam spots which have an interval of about 20 nm and do not overlap each other can be drawn on the recording layer of the optical recording medium. More specifically, the 100×100 VCSEL array A which forms 10,000 beam spots over a width of 200 $\mu$m is set to be inclined at $\theta$=arctan(2/198)=0.57872° with respect to the tangential direction to rotation of the optical recording medium. Accordingly, 10,000 continuous paths which have an interval of about 20 nm between adjacent beam spots and do not overlap each other can be drawn on the recording layer of the optical recording medium. In this state, if input signals to the respective VCSEL elements 1 are individually modulated into pulses at high speed, information corresponding to 10,000 tracks, i.e., 10,000 bits can be simultaneously written or read out. When the disk tangential rate is 10 mm/sec, since the data transfer rate is 1 Mbit/sec per track, 10,000 laser beams over a width of 200 $\mu$m which are irradiated on the recording layer of the optical recording medium or the like realize a data transfer rate of 10 Gbit/sec for 10,000 tracks. As a result, an optical recording medium (optical disk) having a diameter of 120 mm can write information of a total of about 2 Tera bytes (Tbyte).

The manner of obtaining the very small inclination angle of the VCSEL array A will be explained. In the VCSEL array A, if the number of VCSEL elements 1 aligned in the radial direction of the optical recording medium (column direction) is N, the number of VCSEL elements 1 aligned in the transverse line direction of the optical recording medium (row direction) is M, the diameter of the laser emitting portion 3 of the VCSEL array A is D, the inner interval between the laser emitting portions 3 adjacent in the column direction is E, and the inner interval between the laser emitting portions 3 adjacent in the row direction is F, then the length between the outer ends of the VCSEL array A in the row direction is written as MD+(M−1)F, and the length between the outer ends in the column direction as ND+(N−1)E. One inner interval between the laser emitting portions 3 adjacent in the column direction is E+D. Therefore, when all M×N laser beams emitted by the VCSEL array A can continuously draw paths on the recording medium without overlapping each other, the angle $\theta$ the VCSEL array makes with the tangent to rotation of the optical recording medium or the like is given by $\theta$=arctan $\{(D+E)/[MD+(M31\ 1)F]\}$ where $\theta$ is the angle defined by the row direction of the VCSEL array A and the tangential direction to rotation of the optical recording medium.

In this manner, writing/reading is performed by the optical memory head using the VCSEL array. In this writing/reading, tracking is performed. In this tracking, a tracking VCSEL line array is arranged in the radial direction of the optical disk. This VCSEL line array is constituted by linearly arranging VCSEL elements two times the number of VCSEL elements on one column of the writing or reading VCSEL array, i.e., 100×2=200 VCSEL elements in this embodiment. In tracking, tracks formed on the optical disk fluctuate and move along with rotation of the optical disk due to the eccentricity thereof. The fluctuating and moving tracks are detected by the 200 VCSEL elements, and signals obtained by the VCSEL elements in detection are processed to perform tracking control.

Still another embodiment using a VCSEL element having a laser emitting portion with an ultra fine distal tip will be described with reference to FIG. 9.

Figure 9:
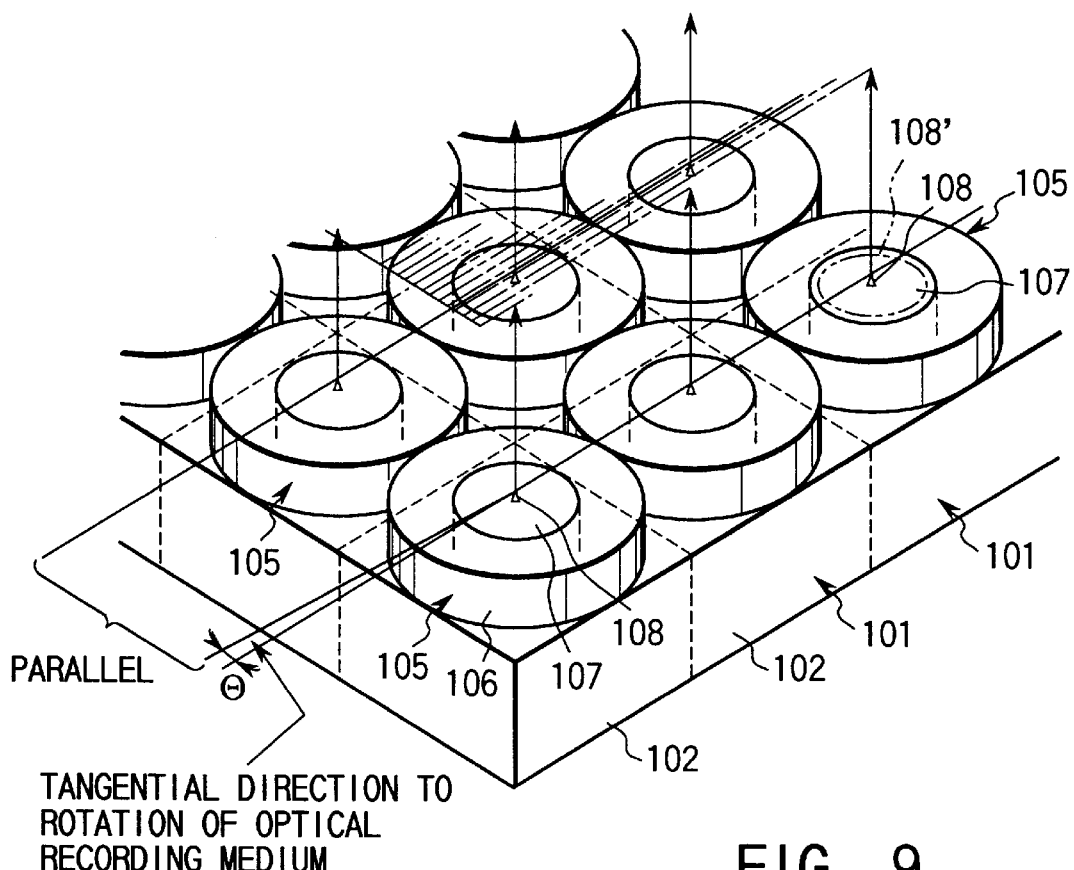
FIG. 9 is an enlarged perspective view of part of an optical memory head according to still another embodiment of the present invention.

A VCSEL element 101 shown in FIG. 9 comprises a substrate 102 with a predetermined thickness containing a multi-layered reflection film and a laser active layer, and a laser emitting portion (which may have a projecting portion) 103 arranged on the lower surface of the substrate 102 to emit a laser beam. A semi-spherical or hole-like recessed portion 104 is formed in the substrate 102 immediately above the laser emitting portion 103.

An optical fiber piece 105 having a small height is constituted by an outer cladding 106 and an inner core 107. From the lower end of the optical fiber piece 105, only the core 107 is exposed. On the upper end, a conical ultra fine distal tip 108 projects from the center of the core 107. The core 107 at the lower end of the optical fiber piece 105 formed in this manner is buried and fixed in the recessed portion 104 in the substrate 102. With this arrangement, only one evanescent light generated from the laser emitting portion 103 travels vertically upward to strike a recording medium via the ultra fine distal tip 108.

Figure 10:
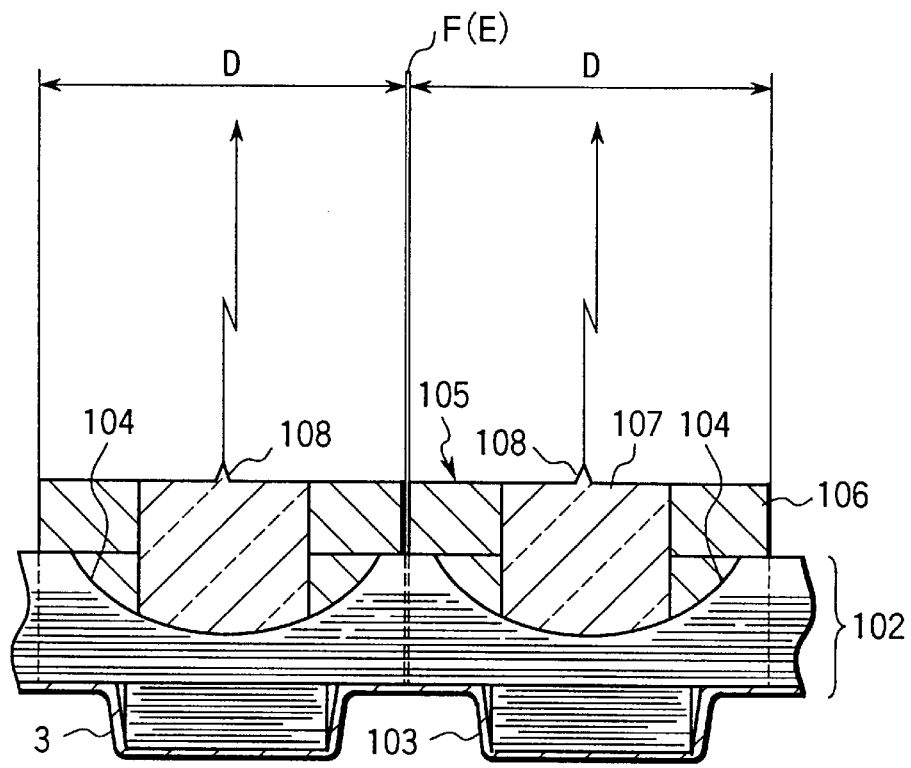
FIG. 10 is a sectional view of the light-emitting portion of the optical memory head in FIG. 9.

FIG. 10 shows the section of the VCSEL element 101. In FIG. 10, the VCSEL element 101 is constituted by the laser emitting portion 103 and the substrate 102. The lower surface of the laser emitting portion 103 is coated with a thin metal film having a thickness of about 10 nm to 100 nm so as to prevent leakage of light. The formation material of the VCSEL element 101 including a coating material is a general one such as n-AlGaAs/GaAs and p-AlGa/GaAs. To improve the laser output and the like, the VCSEL element 101 can also be formed of a material having physical properties similar to or different from those of the materials. The ultra fine distal tip 108 is formed to a size smaller than, or larger than about one hundredth of the wavelength of a laser oscillation beam in the vacuum. If a larger size is selected, the ultra fine distal tip 108 may be formed to have a diameter equal to the diameter of the core 107 (see a chain double-dashed line portion in FIG. 9).

A plurality of VCSEL elements 101 are arranged in a matrix at a predetermined interval to form a VCSEL array A. A method of practically manufacturing the VCSEL array B is the same as in the above embodiment.

One line of laser beams emitted by the ultra fine distal tips 108 of the VCSEL elements 101 arranged on the same row form beam paths corresponding to the number of elements in one line on the recording layer of an optical recording medium or magneto-optic recording medium, as in the above embodiment.

Figure 11:
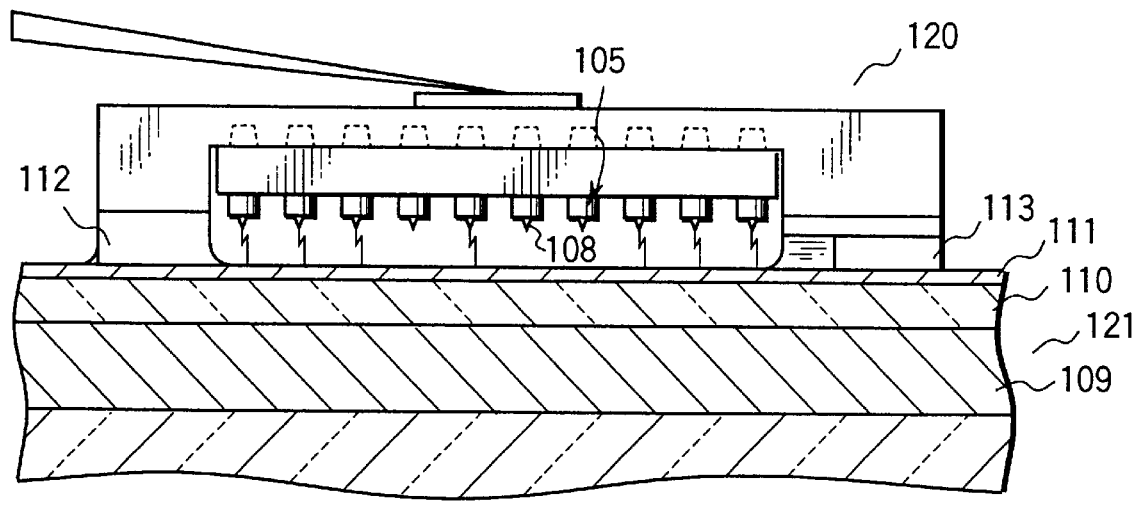
FIG. 11 is a partial enlarged sectional view of an optical memory head of the contact head system.

As shown in FIG. 11, the VCSEL array B having the laser emitting portions with the ultra fine distal tips 108 is arranged with respect to an optical recording medium 121 such that the ultra fine distal tips 108 face the optical recording medium 121. With this arrangement, light reflected by a data bit of the optical recording medium 121 is incident on the VCSEL array B via the ultra fine distal tip 108 to excite the VCSEL element 101 and make it lase, make it unstable oscillation or make it oscillating frequencies shift. If the data bit is set in the amorphous state having a low reflectance when data bit exists, the VCSEL element 101 does not lase even when the light reflected by the data bit reaches the VCSEL element 101 via the ultra fine distal tip 108. When the light is reflected by the crystal phase representing no bit data, the VCSEL element 101 lases. Therefore, by monitoring the presence/absence of laser oscillation, and making the presence/absence correspond to binary data, information written by the writing VCSEL array A head can be read, which is the same as in the above embodiment. The data bit may be set in a crystal state and no data bit may be set in an amorphous state.

In this embodiment, to decrease the Q value of each laser resonator, the mirror of the laser emitting portion 103 is coated with an anti-reflection coating. In addition, a thin metal film or the like for preventing transmission of light is applied on the lower surface of the laser output portion 103 except for the ultra fine distal tip 108. The ultra fine distal tip 108 has a diameter of about 10 nm–50 nm. An injection current flows through each VCSEL element 101, similar to the above embodiment.

This embodiment also employs the contact head system. A writing or reading optical memory head is brought into contact with the surface of the optical recording medium 121, i.e., a recording medium protecting film 110 via a thin lubricant film 111, as shown in FIG. 11. The contact head system of this embodiment has the same structure and function as those of the above embodiment, and a detailed description thereof will be omitted.

The outline of application the VCSEL array B to magneto-optic writing/reading will be explained with reference to FIG. 12. A so-called λ/4 film 115 with an orientation which is coated by ECR sputtering or the like, and a Faraday rotator film 116 are formed between the VCSEL element 101 and the substrate 102 constituted by the n-AlGaAs/GaAs multi-layered reflection mirror and the laser active layer. The VCSEL element 101 having this arrangement operates similarly to the VCSEL element 1 of the above embodiment, and a description of the function of the VCSEL element 101 will be omitted.

Figure 8:
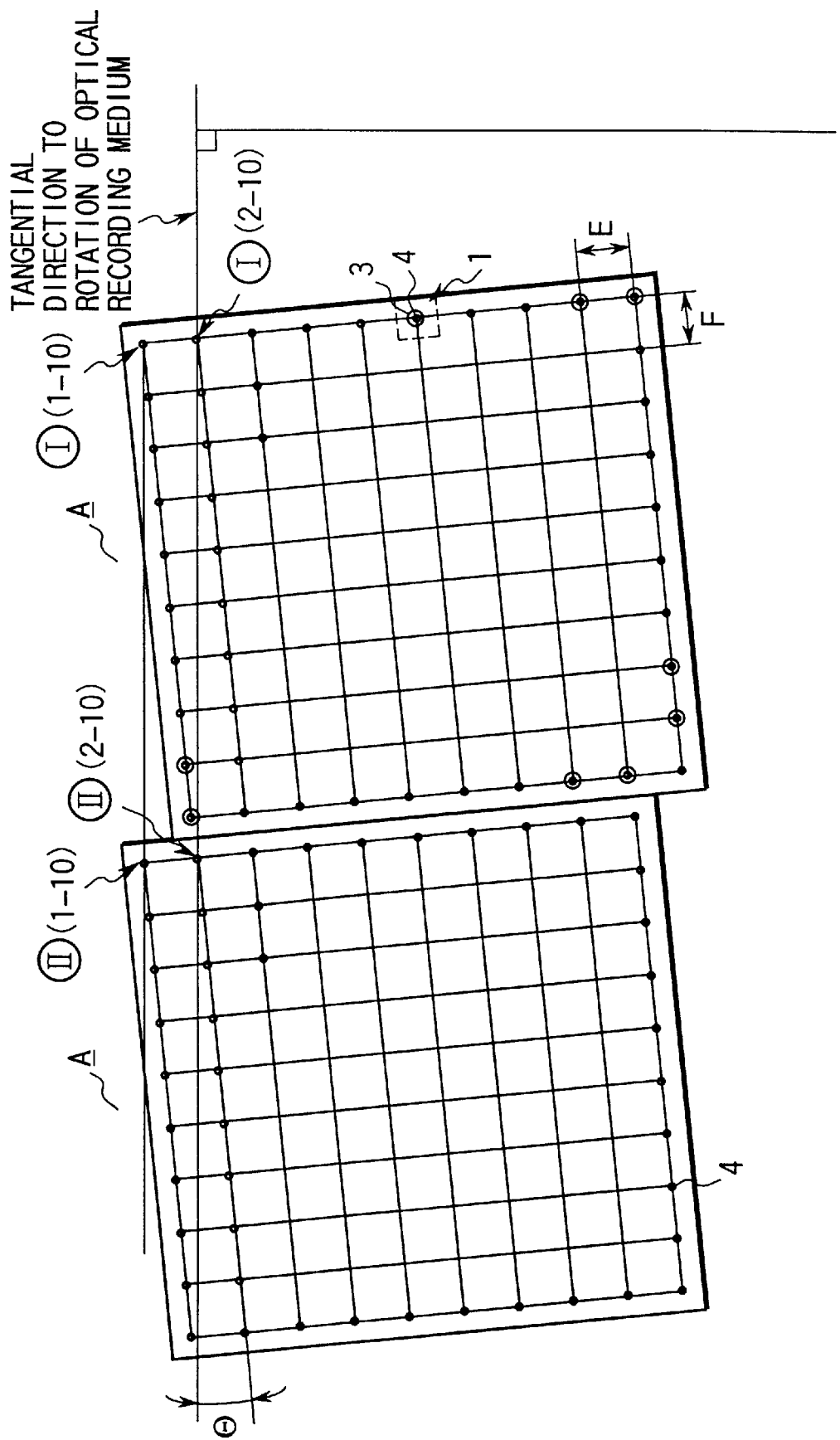
FIG. 8 is a plan view of an optical memory head with a compensation element according to another embodiment of the present invention.

Also in this embodiment, a faulty element compensation array can be arranged similar to the above embodiment in FIG. 8.

Figure 12:
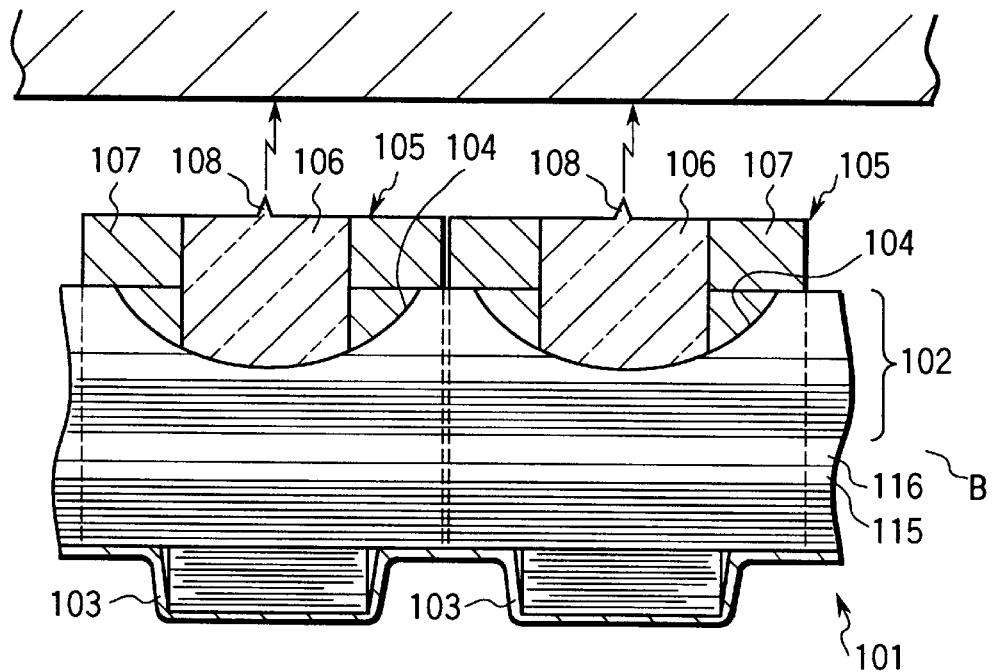
FIG. 12 is a partial enlarged sectional view of the light-emitting portion of the optical memory head in FIG. 9.

As shown in FIG. 12, the VCSEL array B in this embodiment comprises of the plurality of VCSEL elements 101, individual electrodes, and a common electrode. Each VCSEL element 101 comprises the substrate 102, the laser emitting portion 103, and the optical fiber piece 105 with the ultra fine distal tip 108. In the VCSEL elements 101 ideally constructing a regular matrix, if the diameter of each optical fiber piece 105 is, for example, 150 μm, the interval between the respective optical fiber pieces 105 is 150 μm. As an optimum arrangement, VCSEL elements 101 are arranged in a regular matrix having 100 VCSEL elements 101 in the X-axis direction and 100 VCSEL elements 101 in the Y-axis direction, as shown in FIG. 12. An ultra fine distal tip 108 having a diameter of about 10 nm is formed at the center of the optical fiber piece 105 of each VCSEL element 101. The ultra fine distal tip 108 can be formed by etching each of the optical fibers or the like to form a plurality of needle arrays. The ultra fine distal tip 108 functions as a distal tip window for externally emitting an evanescent light wave generated by the VCSEL element 101 as a beam.

Figure 13:
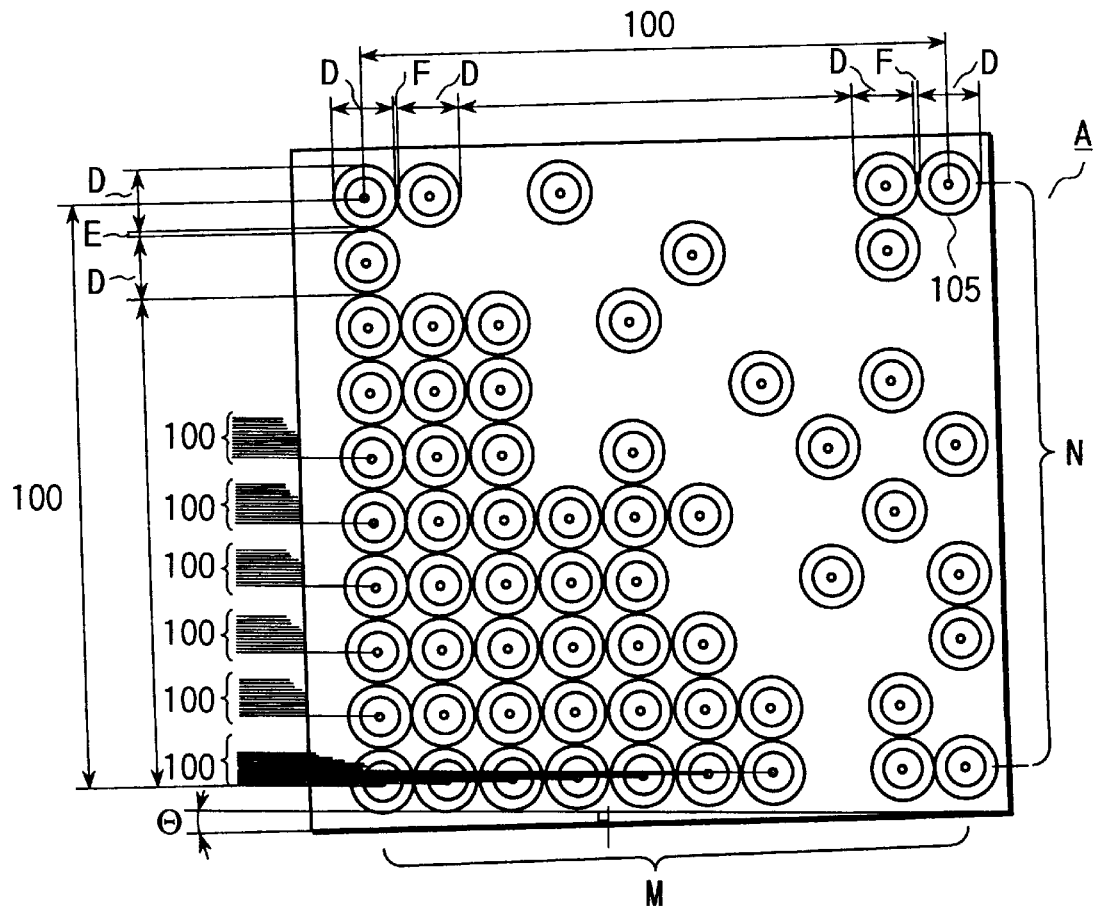
FIG. 13 is a plan view of the optical memory head in FIG. 9.

The 100×100 VCSEL array B shown in FIG. 12 is horizontally held with the ultra fine distal tip 108 facing up, and arranged to be parallel to and face the recording surface of the optical recording medium at a very small distance. A total of 10,000 laser beams emitted vertically upward from the 100×100 VCSEL array B form a total of 10,000 beam spots on the recording layer of the optical recording medium over a width of about 15,000 μm. As shown in FIG. 13, since the number of VCSEL elements 101 on one line in the transverse direction of the VCSEL array B is 100, the width of 100 beams formed by these elements is about 10–20 nm×100, i.e., 1–2 μm, which is much smaller than the diameter of the optical fiber piece 105. A group of 100 beams forms a width of about 1–2 μm, and groups of 100 beams are arranged at an interval of 148–149 μm. Therefore, the tracks are arranged at intervals. Since a point which the beam spot strikes changes in reflectance or color depending on the material of the recording layer, similar to a writing method in a general optical recording medium, information is written by a well-known method of making the change correspond to a binary signal.

If the VCSEL array B is set to be inclined at a fine angle with respect to the tangent (tangential direction) to rotation of the optical recording medium, as shown in FIG. 13, 10,000 paths of 10,000 beam spots can be drawn in units of 100 continuous paths which do not overlap each other on the recording layer of the optical recording medium. More specifically, the 100×100 VCSEL array B which forms 10,000 beam spots over a width of 15,000 μm is set to be inclined with respect to the tangential direction to rotation of the optical recording medium at θ=arctan (151/15099)= about 0.573°. With this setting, 10,000 paths can be drawn in units of 100 continuous paths which do not overlap each other on the recording layer of the optical recording medium. In this state, if input/output signals to/from the respective VCSEL elements 101 are individually modulated into pulses at high speed, information corresponding to 10,000 tracks, i.e., 10,000 bits can be simultaneously written or read out. When the disk tangential rate is 10 mm/sec, since the data transfer rate is 1 Mbit/sec per track, 10,000 laser beams forming a width of 15,000 μm which are irradiated on the recording layer of the optical recording medium or the like realize a data transfer rate of 10 Gbit/sec for 10,000 tracks. As a result, an optical recording medium having a diameter of 120 mm can write information of a total of about 1 Tbyte, similar to the above embodiment.

Figure 14:
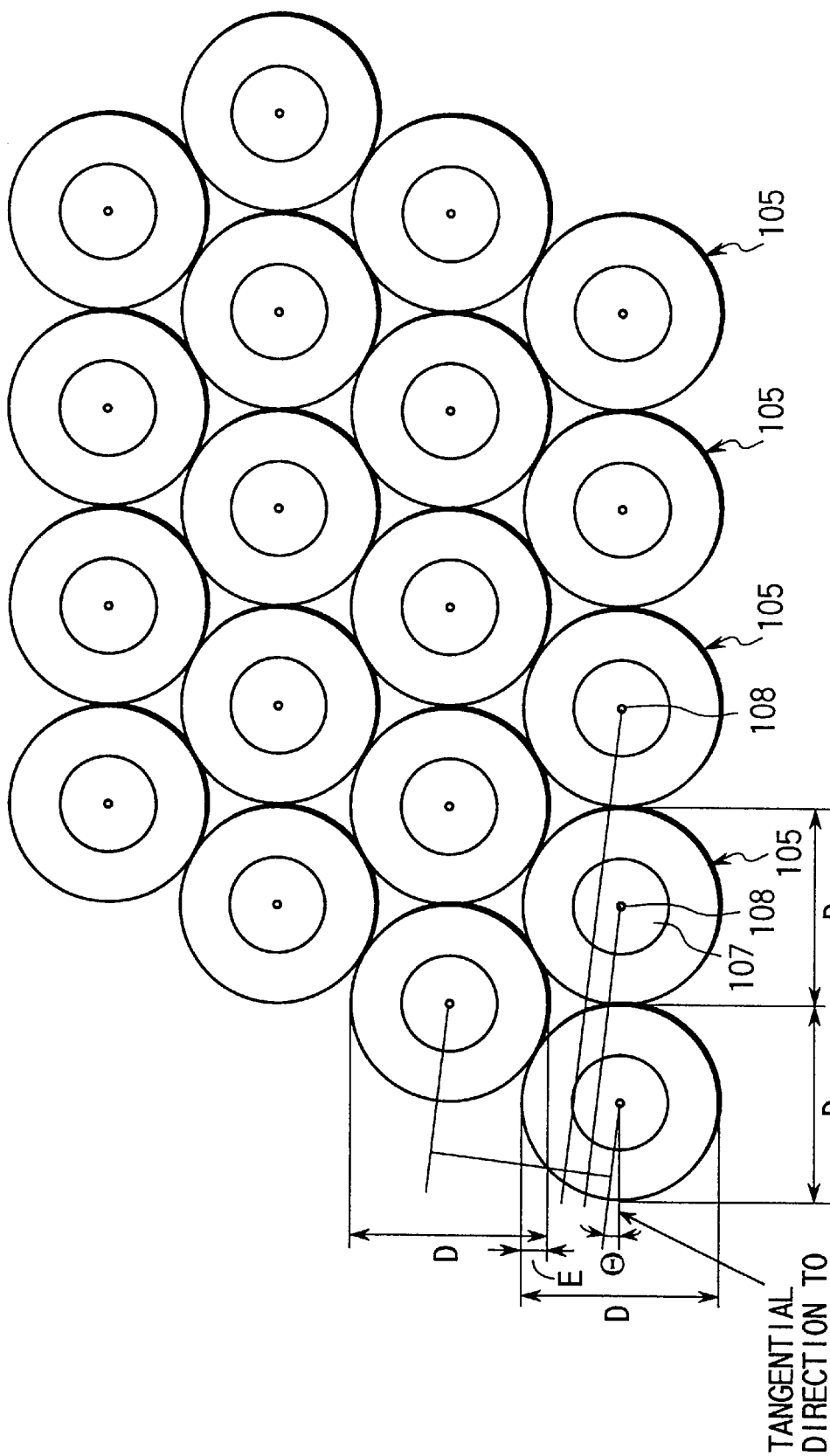
FIG. 14 is a plan view of an optical memory head according to still another embodiment of the present invention.

The manner of obtaining the very small inclination angle of the VCSEL array B is the same as in the above embodiment, and a description thereof will be omitted. When the optical fiber pieces 105 are arranged in a staggered pattern, as shown in FIG. 14, if E is the vertical inner interval between the cores 107 adjacent in the column direction, the length between the external ends in the oblique column direction is ND−(N−1)E. In this case, the angle θ defined by the VCSEL array B and the tangent to rotation of the optical recording medium or the like is θ=arctant {(D−E)/[MD+(M−1)F]} at maximum.

In tracking operation, the tracking grooves may be formed on the optical disk at intervals of 2 μm, 100 beam spots may be shifted by 2 μm in the process of tracing the grooves.

The light beam emitted to the recording medium may use an ordinal light of about 100 nm.

According to the present invention, if a VCSEL array constituted by arranging elements in a matrix form is used for an optical memory head, a plurality of beam spots having a size equal to or smaller than a theoretically limit value in an optical element can be formed. Compared to a conventional optical memory head, a much larger amount of information can be written in or read out from an optical recording medium or magneto-optic recording medium.

Since the VCSEL array is inclined with respect to the tangential direction to rotation of the optical recording medium at a predetermined fine angle to constitute the optical memory head, laser beams via the ultra fine hole windows or ultra fine distal tips of a plurality of laser emitting portions can easily form many writing/reading tracks on the recording layer of the optical recording medium or magneto-optic recording medium.

An optical memory head in which a plurality of beam spots formed by laser beams emitted by VCSEL elements arranged on the same row fall between two VCSEL elements arranged on the same column and adjacent rows is provided. Even many writing/reading tracks can be reliably formed on the recording layer of the optical recording medium or magneto-optic recording medium without crossing or overlapping each other. In addition, many beam spots can be formed within the minimum unit area.

An optical memory head in which a VCSEL array for compensating a faulty element is separately arranged parallel to the VCSEL array, and ultra fine hole windows on the same row and column in the two VCSEL arrays exist on the same track is provided. Accordingly, a compensation optical memory head can be ensured. Compared to the use of the conventional optical memory head, a much larger amount of information can be written in or read out from the optical recording medium or magneto-optic recording medium at very high accuracy and reliability.

Though the present optical head system has an enormous memory capacity, the disk rotation speed is very low because of its small bit size, and this system can realize a very high data transfer rate with a very slow disk rotation speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. An optical memory head comprising:
    a laser array comprising a plurality of vertical cavity surface emitting laser elements arranged in a matrix and each laser element emitting an evanescent wave using near-field optics; and
    a head unit which holds said laser array in an inclined position with respect to a direction tangential to rotation of an optical recording medium.

2. An optical memory head according to claim 1, wherein said head unit comprises a heat sink member which receives said laser array and a plurality of pads mounted on said heat sink member and being in contact with said recording medium via a lubricant.

3. An optical head according to claim 2, wherein the lubricant is perfluoropolyether.

4. An optical memory head according to claim 1, wherein each laser element has an ultra fine hole formed in a center of a laser output part.

5. An optical memory head according to claim 4, wherein the ultra fine hole has a diameter of approximately one hundredth of a wavelength of a laser oscillation beam in a vacuum.

6. An optical memory head according to claim 5, wherein said fine hole has a diameter of 10–50 nm.

7. An optical memory head according to claim 1, wherein each laser element has an ultra fine distal tip formed at a center of a laser output part.

8. An optical memory head according to claim 7, wherein said ultra fine distal tip has a diameter of approximately one hundredth of a wavelength of a laser oscillation beam in a vacuum.

9. An optical memory head according to claim 1, wherein said laser output part has a surface coated by a metal film of 10 nm to 100 nm.

10. An optical memory head according to claim 1, wherein said head unit further comprises:
    a heat sink member for receiving said semiconductor laser array with a laser output part directed downward;
    a plurality of pads mounted on a bottom of said heat sink member and being in contact with the recording medium via a lubricant layer; and
    a gimbals member for pressing said heat sink member downward to allow said pads to contact the optical recording medium.

11. An optical memory head according to claim 1, wherein said laser array comprises 100×100 vertical cavity surface emitting laser elements.

12. An optical memory head according to claim 1, wherein said laser element comprises:
   a substrate containing a multi-layered reflection film and a laser active layer;
   a laser emitting portion arranged on a lower surface of said substrate for emitting a laser;
   a recessed portion formed in the substrate; and
   an optical fiber piece comprising an outer cladding and an inner core having at its center a conical ultra fine distal tip.

13. An optical memory head comprising:
   a laser array comprising a plurality of vertical cavity surface emitting laser elements arranged in a matrix and each emitting, using near-field optics, an evanescent wave which is output from an ultra fine hole.

14. An optical memory head according to claim 13, wherein said laser array is inclined with respect to a direction tangential to the rotation of an optical recording medium.

15. An optical memory head according to claim 13, wherein the inclined position of said laser array is at an angle which makes the beam spots formed by said laser elements arranged on the same row fall between two vertical cavity surface emitting laser elements arranged on a same column and adjacent rows of the matrix.

16. An optical head according to claim 15, further comprising an auxiliary laser array which is arranged parallel to said laser array, said auxiliary laser array compensating for a faulty element and comprising a plurality of vertical cavity surface emitting laser elements, and wherein ultra fine holes on the same row and column in said laser array and said auxiliary laser array exist on the same track.

17. An optical memory head according to claim 13, wherein a laser output part associated with each laser element has a surface coated by a metal film of 10 nm to 100 nm.

18. An optical memory head according to claim 13, wherein said fine hole has a diameter of 10–50 nm.

19. An optical memory head according to claim 13, further comprising:
   a heat sink member which receives said laser array with a laser output part directed downward;
   a plurality of pads mounted on a bottom of said heat sink member and being in contact with the recording medium via a lubricant layer; and
   a gimbals member for pressing said heat sink member downward to allow said pads to contact the optical recording medium.

20. An optical memory head according to claim 13, wherein said laser array further comprises a plurality of semiconductor laser elements arrayed in a matrix form.

21. An optical memory head according to claim 13, wherein said each of said laser elements further comprise:
   a substrate containing a multi-layered reflection film and a laser active layer;
   a laser emitting portion arranged on a lower surface of said substrate for emitting a laser;
   a recessed portion formed in the substrate; and
   an optical fiber piece consisting of an outer cladding and an inner core having at its center a conical ultra fine distal tip.

22. An optical memory head comprising:
   a vertical cavity surface emitting laser array comprising a plurality of vertical cavity surface emitting laser elements arranged in a matrix form and each having a laser output part with a fine portion for emitting light;
   a head unit which holds said laser array in a position such that a layout direction of said laser elements is inclined with respect to a direction tangential to the rotation of an optical recording medium, wherein said head unit comprises a heat sink member for receiving said laser array and a plurality of pads mounted on said heat sink and being in contact with said recording medium via a lubricant.

23. An optical head according to claim 22, wherein the lubricant is perfluoropolyether.

24. An optical memory head according to claim 22, wherein said fine portion is an ultra fine hole formed in a center of said laser output part.

25. An optical memory head according to claim 24, wherein the ultra fine hole has a diameter approximately one hundredth of a wavelength of a laser oscillation beam in a vacuum.

26. An optical memory head according to claim 25, wherein said fine hole has a diameter of 10 nm to 50 nm.

27. An optical memory head according to claim 22, wherein said fine portion is an ultra fine distal tip formed at a center of said laser output part.

28. An optical memory head according to claim 27, wherein said ultra fine distal tip has a diameter of approximately one hundredth of a wavelength of a laser oscillation beam in a vacuum.

29. An optical memory head according to claim 22, wherein said laser output part has a surface coated by a metal film of 10 nm to 100 nm.

30. An optical memory head according to claim 22, wherein each of said laser elements comprises:
   a substrate containing a multi-layered reflection film and a laser active layer;
   a laser emitting portion arranged on a lower surface of said substrate for emitting a laser;
   a recessed portion formed in the substrate; and
   an optical fiber piece consisting of an outer cladding and an inner core having at its center a conical ultra fine distal tip.

31. An optical memory head comprising:
   a vertical cavity surface emitting laser array comprising a plurality of vertical cavity surface emitting laser elements arranged in a matrix and each having a laser output part with a fine portion for emitting a light; and
   a head unit which holds said laser array in a slightly inclined layout direction with respect to a direction tangential to rotation of an optical recording medium, said head unit further comprising:
      a heat sink member which receives said laser array with said laser output part directed downward;
      a plurality of pads mounted on a bottom of said heat sink member and contacting the recording medium via a lubricant layer; and
      a gimbals member for pressing said heat sink member downward to allow said pads to contact the optical recording medium.

32. An optical head according to claim 31, wherein said lubricant layer is perfluoropolyether.

33. An optical memory head according to claim 31, wherein said fine portion is an ultra fine hole formed in a center of said laser output part.

34. An optical memory head according to claim 33, wherein the ultra fine hole has a diameter approximately one hundredth of a wavelength of a laser oscillation beam in a vacuum.

35. An optical memory head according to claim 34, wherein said fine hole has a diameter of approximately 10 nm to 50 nm.

36. An optical memory head according to claim 31, wherein said fine portion is an ultra fine distal tip formed at a center of said laser output part.

37. An optical memory head according to claim 36, wherein said ultra fine distal tip has a diameter of approximately one hundredth of a wavelength of a laser oscillation beam in a vacuum.

38. An optical memory head according to claim 31, wherein said laser output part has a surface coated by a metal film having a thickness of approximately 10 nm to 100 nm.

39. An optical memory head according to claim 31, wherein each of said laser elements comprises:
- a substrate containing a multi-layered reflection film;
- a laser active layer;
- a laser emitting portion arranged on a lower surface of said substrate for emitting a laser;
- a recessed portion formed in the substrate; and
- an optical fiber piece comprising an outer cladding and an inner core having at its center a conical ultra fine distal tip.

40. An optical memory head comprising:
- a vertical cavity surface emitting laser array comprising a plurality of vertical cavity surface emitting laser elements arranged in a matrix form and each having a laser output part with an ultra fine hole;
- a heat sink member which receives said laser array with said laser output part directed downward;
- a plurality of pads mounted on a bottom of said heat sink member and being in contact with the recording medium via a lubricant layer; and
- a gimbals member for pressing said heat sink member downward to allow said pads to contact the optical recording medium.

41. An optical memory head according to claim 40, wherein said vertical cavity surface emitting laser array is inclined with respect to a direction tangential to the rotation of the optical recording medium.

42. An optical memory head according to claim 40, wherein said inclined array is positioned at a predetermined fine angle to said tangential direction so as to make a plurality of beam spots formed by laser beams emitted by said laser elements arranged on the same row fall between two laser elements arranged on the same column and adjacent rows.

43. An optical head according to claim 42, further comprising:
- a vertical cavity surface emitting laser array which is arranged parallel to said vertical cavity surface emitting laser array, and which compensates for a faulty element, and
- wherein ultra fine holes on the same row and column in said two vertical cavity surface emitting laser arrays exist on the same track.

44. An optical memory head according to claim 40, wherein said laser output part has a surface coated by a metal film of approximately 10 nm to 100 nm.

45. An optical memory head according to claim 40, wherein said fine hole has a diameter of approximately 10 nm to 50 nm.

46. An optical memory head according to claim 40, wherein each of said laser elements comprises:
- a substrate containing a multi-layered reflection film and a laser active layer;
- a laser emitting portion arranged on a lower surface of said substrate for emitting a laser;
- a recessed portion formed in the substrate; and
- an optical fiber piece comprising an outer cladding and an inner core having at its center a conical ultra fine distal tip.

* * * * *